(12) United States Patent
Zhao et al.

(10) Patent No.: US 10,474,041 B1
(45) Date of Patent: Nov. 12, 2019

(54) DIGITAL LITHOGRAPHY WITH EXTENDED DEPTH OF FOCUS

(71) Applicant: Applied Materials, Inc., Santa Clara, CA (US)

(72) Inventors: Guoheng Zhao, Palo Alto, CA (US); Jeremy Rolfe Nesbitt, San Jose, CA (US); Christopher Dennis Bencher, Cupertino, CA (US); Mehdi Vaez-Iravani, Los Gatos, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/267,359

(22) Filed: Feb. 4, 2019

(51) Int. Cl.
| | |
|---|---|
| G03B 27/72 | (2006.01) |
| *G03F 7/20* | (2006.01) |
| *G03F 9/00* | (2006.01) |
| G02B 27/10 | (2006.01) |
| G02B 26/08 | (2006.01) |

(52) U.S. Cl.
CPC ...... *G03F 7/70641* (2013.01); *G03F 7/70158* (2013.01); *G03F 7/70291* (2013.01); *G03F 7/70616* (2013.01); *G03F 9/7026* (2013.01); *G02B 26/0833* (2013.01); *G02B 27/1086* (2013.01)

(58) Field of Classification Search
CPC ............ G02B 26/0833; G02B 27/1086; G03F 7/70158; G03F 7/70291; G03F 7/70258; G03F 7/70266; G03F 7/70283; G03F 7/70316; G03F 7/70325; G03F 7/70333; G03F 7/70358; G03F 7/70375–70391; G03F 7/70425; G03F 7/70616; G03F 7/70641; G03F 9/7023–7034

USPC ... 355/22, 39, 46, 52, 53, 55–63, 67–71, 72, 355/75, 77; 250/492.1, 492.2, 492.22, 250/492.23, 493.1, 494.1; 356/3, 356/4.01–4.08, 125, 126, 138, 139.1, 356/399–401

See application file for complete search history.

(56) References Cited

U.S. PATENT DOCUMENTS

| | | | |
|---|---|---|---|
| 6,238,852 B1 | 5/2001 | Klosner | |
| 6,870,554 B2 | 3/2005 | Jain | |
| 8,390,786 B2 | 3/2013 | Laidig | |
| 9,519,226 B2 | 12/2016 | Chen et al. | |
| 9,733,573 B2 | 8/2017 | Markle et al. | |
| 2002/0005940 A1 | 1/2002 | Hatada et al. | |
| 2002/0097495 A1* | 7/2002 | Mei ................... | G02B 26/0841 359/618 |

(Continued)

*Primary Examiner* — Christina A Riddle
(74) *Attorney, Agent, or Firm* — Patterson + Sheridan LLP (57) ABSTRACT

The present disclosure generally relates to lithography devices comprising an autofocus system. The autofocus system is configured to individually focus and adjust a plurality of digital micromirror devices. The autofocus system comprises a single light beam and a diffractive optical element configured to split the single light beam into two or more split beams. The two or more split beams are directed to a beam splitter. The two or more split beams are then reflected off the surface of a substrate to at least one position sensor. The position sensor is configured to measure the position of each of the two or more split beams. At least one digital micromirror device is then individually adjusted based on the measured position to adjust the focus of the at least one digital micromirror device with respect to surface height and tilt variations of the substrate.

20 Claims, 10 Drawing Sheets

(56) References Cited

U.S. PATENT DOCUMENTS

| | | | |
|---|---|---|---|
| 2004/0042001 A1* | 3/2004 | Vaez-Iravani | G01N 21/8806 356/237.2 |
| 2004/0075882 A1* | 4/2004 | Meisburger | G03F 7/70216 359/290 |
| 2008/0037083 A1* | 2/2008 | Ogasawara | G03H 1/02 359/3 |
| 2009/0046262 A1 | 2/2009 | Okazaki et al. | |
| 2017/0017165 A1 | 1/2017 | Bencher et al. | |

* cited by examiner

DIGITAL LITHOGRAPHY WITH EXTENDED DEPTH OF FOCUS

BACKGROUND

Field

Embodiments of the present disclosure generally relate to apparatuses, systems, and methods for processing one or more substrates, and more specifically to apparatuses, systems, and methods for performing photolithography processes.

Description of the Related Art

Photolithography is widely used in the manufacturing of semiconductor devices and display devices, such as liquid crystal displays (LCDs) and organic light-remitting diode (OLED) displays. Large area substrates are often utilized in the manufacture of LCDs and OLEDs. LCDs and OLEDs, or flat panels, are commonly used for active matrix displays, such as computers, touch panel devices, personal digital assistants, cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator, such as an assembly utilizing digital micromirror devices (DMD), exposes selected areas of the light-sensitive photoresist to light as part of a pattern, causing chemical changes to the photoresist in the selective areas to prepare these selective areas for subsequent material removal and/or material addition processes to create the electrical features. However, the DMDs utilized with this process are generally quite small, having a resolution that is far smaller than a field size of a projection lens used with exposing the selected areas. Because of the DMD size limit, numerous pattern generators or projection units are needed to achieve desired throughput. As the number of projection units increases, the cost, reliability, and alignment between the projection units becomes increasingly difficult to manage.

In order to continue to provide display devices and other devices at the prices demanded by consumers, new apparatuses and approaches are needed to precisely and cost-effectively create patterns on substrates.

SUMMARY

The present disclosure generally relates to lithography devices comprising an autofocus system. The autofocus system is configured to individually focus and adjust a plurality of digital micromirror devices. The autofocus system comprises a single light beam and a diffractive optical element configured to split the single light beam into two or more split beams. The two or more split beams are directed to a beam splitter. The two or more split beams are then reflected off the surface of a substrate to at least one position sensor. The position sensor is configured to measure the position of each of the two or more split beams. At least one digital micromirror device is then individually adjusted based on the measured position to adjust the focus of the at least one digital micromirror device with respect to surface height and tilt variations of the substrate.

In one embodiment, an autofocus system comprises a light source configured to output a light beam and a diffractive optical element disposed adjacent to the light source. The diffractive optical element is configured to split the light beam into two or more split beams. The autofocus system further comprises a beam splitter disposed adjacent to the diffractive optical element and two or more digital micromirror devices disposed adjacent to the beam splitter. The autofocus system further comprises at least one position sensor. The two or more split beams form two or more light spots on the at least one position sensor. The at least one position sensor is configured to measure a position of each of the two or more light spots.

In another embodiment, a method of autofocusing two or more digital micromirror devices comprises outputting a light beam, splitting the light beam into two or more split beams, directing the two or more split beams to a beam splitter, and directing the two or more split beams from the beam splitter to a substrate. The two or more split beams contact the substrate at an angle. The method further comprises directing the two or more split beams from the substrate to at least one position sensor. The two or more split beams form two or more light spots on the at least one position sensors. The method further comprises measuring a position of each of the two or more light spots using the at least one position sensor.

In yet another embodiment, a method of autofocusing two or more digital micromirror devices comprises reflecting two or more light beams off of a beam splitter, reflecting the two or more light beams from the beam splitter off of a substrate, and directing the two or more light beams from the substrate to at least one position sensor. The two or more light beams form two or more light spots on the at least one position sensor. The method further comprises measuring a position of each of the two or more light spots using the at least one position sensor and adjusting, individually, at least one digital micromirror device of the two or more digital micromirror devices based on the measured position of each of the two or more light spots.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to lithography devices comprising an autofocus system. The autofocus system is configured to individually focus and adjust a plurality of digital micromirror devices. The autofocus system comprises a single light beam and a diffractive optical element configured to split the single light beam into two or more split beams. The two or more split beams are directed to a beam splitter. The two or more split beams are then reflected off the surface of a substrate to at least one position sensor. The position sensor is configured to measure the position of each of the two or more split beams. At least one digital micromirror device is then individually adjusted based on the measured position to adjust the focus of the at least one digital micromirror device with respect to surface height and tilt variations of the substrate.

Figure 1A:
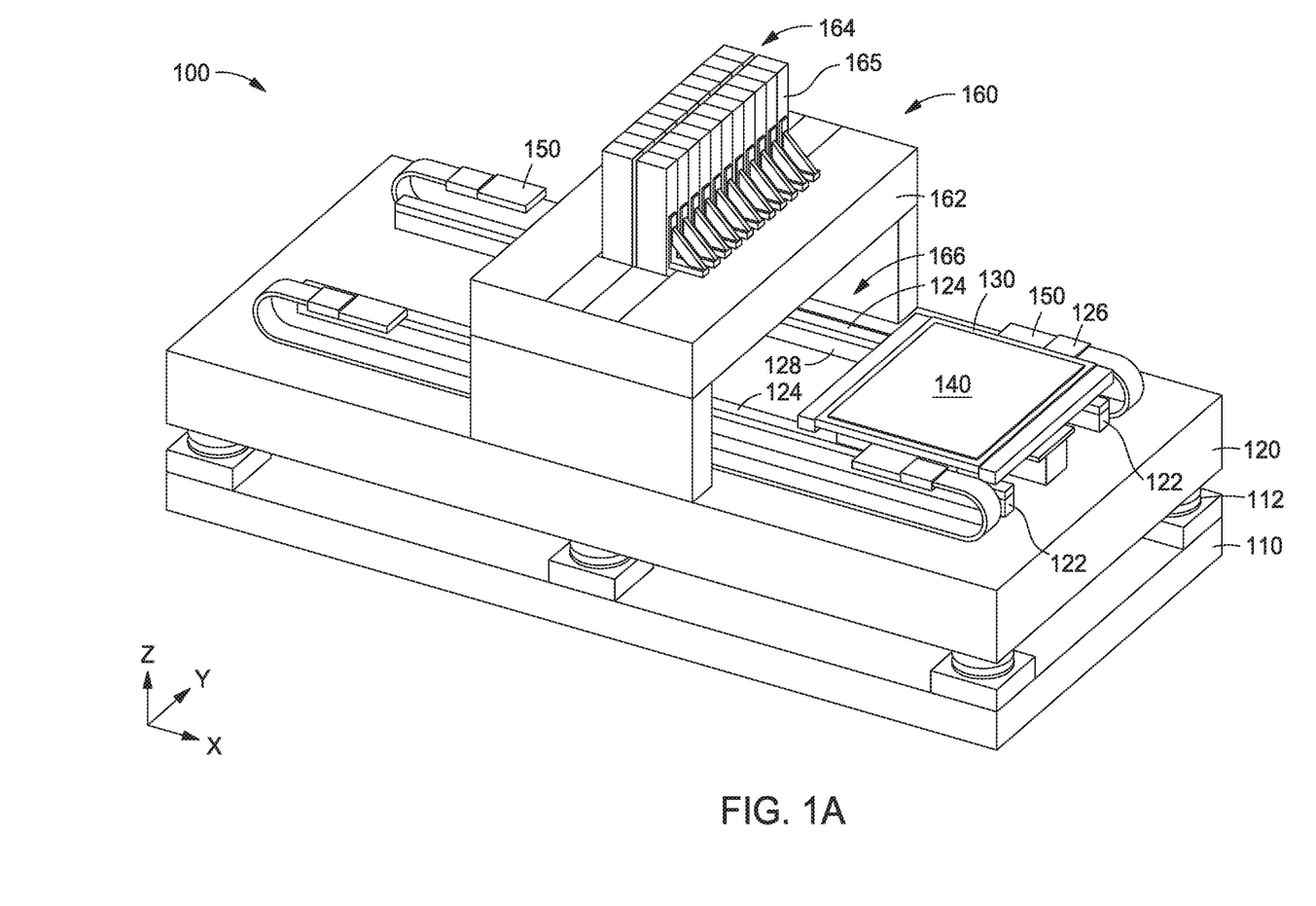
FIG. 1A is a perspective view of a photolithography system, according to one embodiment.

FIG. 1A is a perspective view of a photolithography system 100 according to embodiments disclosed herein. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example Alkaline Earth Boro-Aluminosilicate, used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly(methyl methacrylate), poly (methyl glutarimide), and SU-8. In this manner, the pattern is created on a surface of the substrate 140 to form the electronic circuitry.

The system 100 includes a pair of supports 122 and a pair of tracks 124. The pair of supports 122 is disposed on the slab 120, and, in one embodiment, the slab 120 and the pair of supports 122 are a single piece of material. The pair of tracks 124 is supported by the pair of the supports 122, and the stage 130 moves along the tracks 124 in the x-direction. In one embodiment, the pair of tracks 124 is a pair of parallel magnetic channels. As shown, each track 124 of the pair of tracks 124 is linear. In another embodiment, air bearings are utilized for high accurate non-contact motion, and linear motors are configured to provide the force to move the stage 130 back and forth in the x-direction and the y-direction. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIG. 2A). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the x-direction from a loading position, as shown in FIG. 1A, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or z-axis. The angular position measurement can be used to hold the angular position constant during scanning by means of a servo mechanism or it can be used to apply corrections to the positions of the patterns being written on the substrate 140 by the image projection apparatus 270, 281, shown in FIG. 2A and FIG. 2B. These techniques may be used in combination.

Figure 1B:
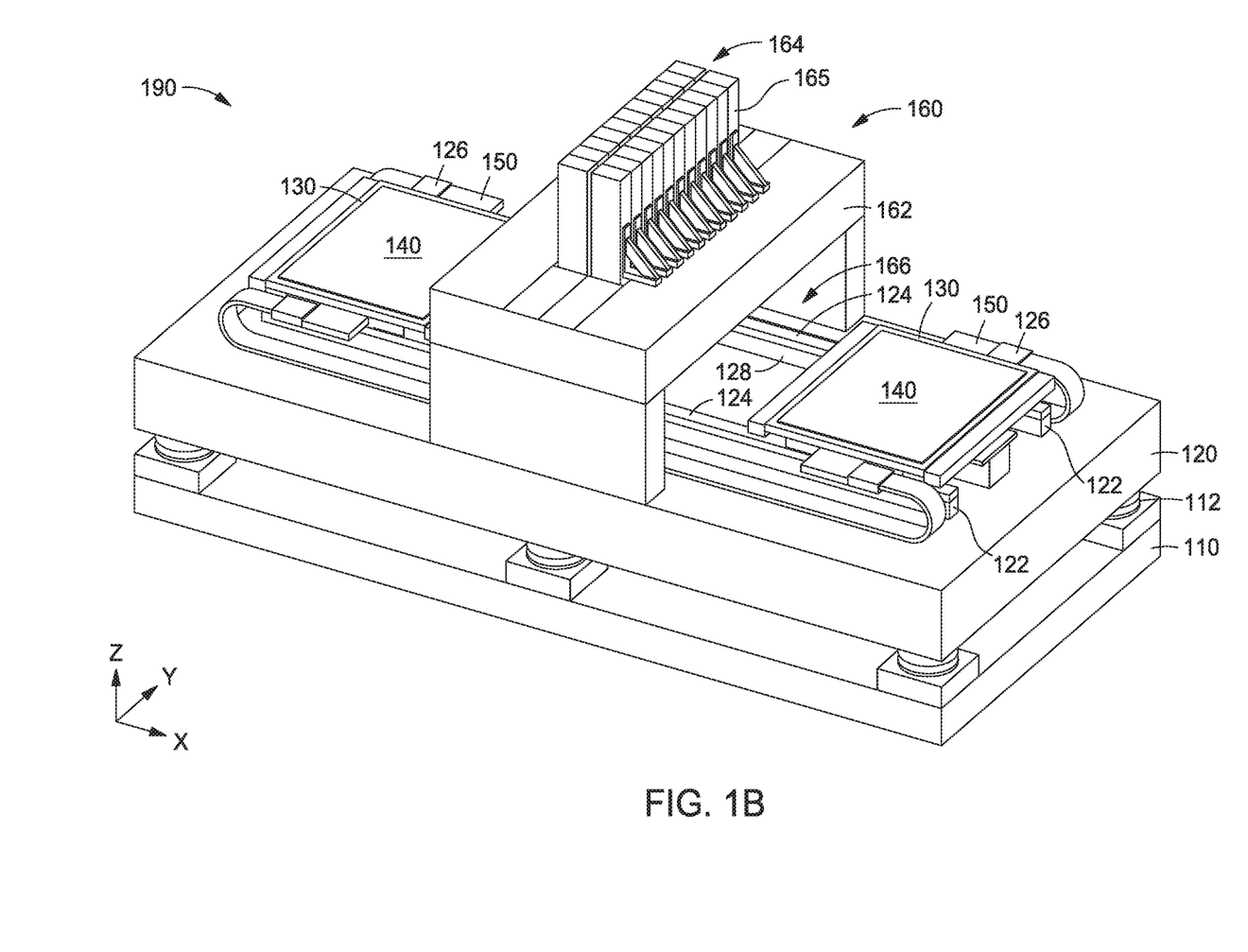
FIG. 1B is a perspective view of a photolithography system having two stages, according to another embodiment.

FIG. 1B is a perspective view of a photolithography system 190 according to embodiments disclosed herein. The system 190 is similar to the system 100; however, the system 190 includes two stages 130. Each of the two stages 130 is capable of independent operation and can scan a substrate 140 in one direction and step in the other direction. In some embodiments, when one of the two stages 130 is scanning a substrate 140, another of the two stages 130 is unloading an exposed substrate and loading the next substrate to be exposed.

While FIGS. 1A-1B depict two embodiments of a photolithography system, other systems and configurations are also contemplated herein. For example, photolithography systems including any suitable number of stages are also contemplated.

Figure 2A:
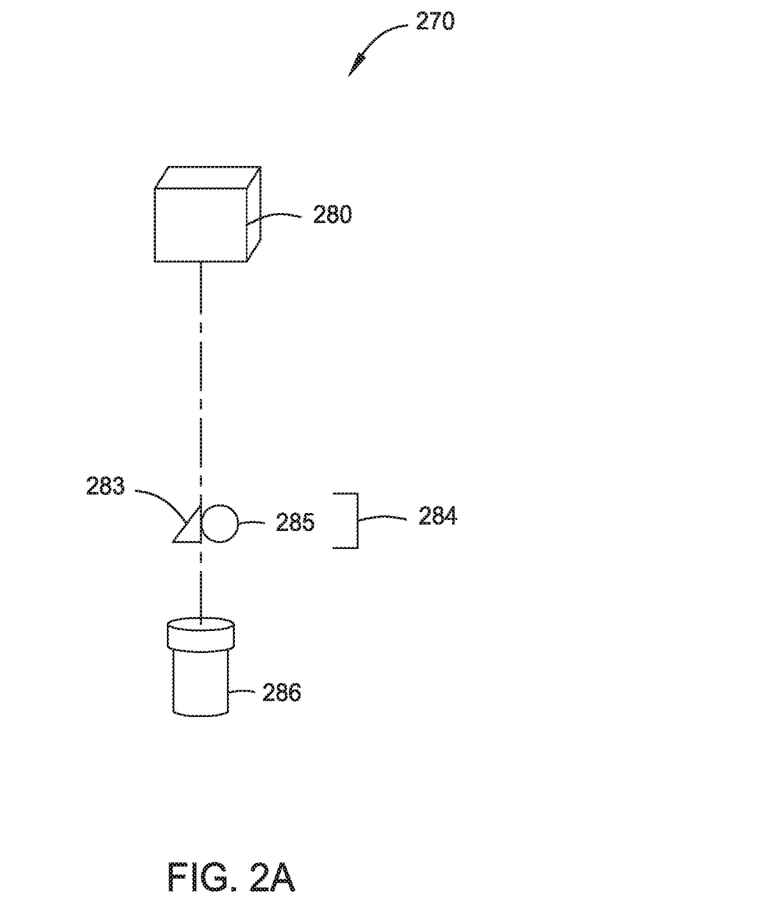
FIG. 2A is a perspective schematic view of an image projection apparatus, according to one embodiment.

FIG. 2A is a perspective schematic view of an image projection apparatus 270 according to one embodiment, which is useful for a photolithography system, such as system 100 or system 190. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, microLEDs, OLEDs, digital micromirror devices (DMDs), liquid crystal displays (LCDs), and vertical-cavity surface-emitting lasers (VCSELs).

In operation, the spatial light modulator 280 is used to modulate one or more properties of the light, such as amplitude, phase, or polarization, which is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and the back through the lens of the camera 285 and imaged onto sensors to detect whether the image projection apparatus 270 is in focus. The camera 285 is used to image the substrate, such as substrate 140, to ensure the alignment of the image projection apparatus 270 and photolithography system 100 or 190 is correct or within an predetermined tolerance. The projection optics 286, such as one or more lenses, is used to project the light onto the substrate, such as the substrate 140.

Figure 2B:
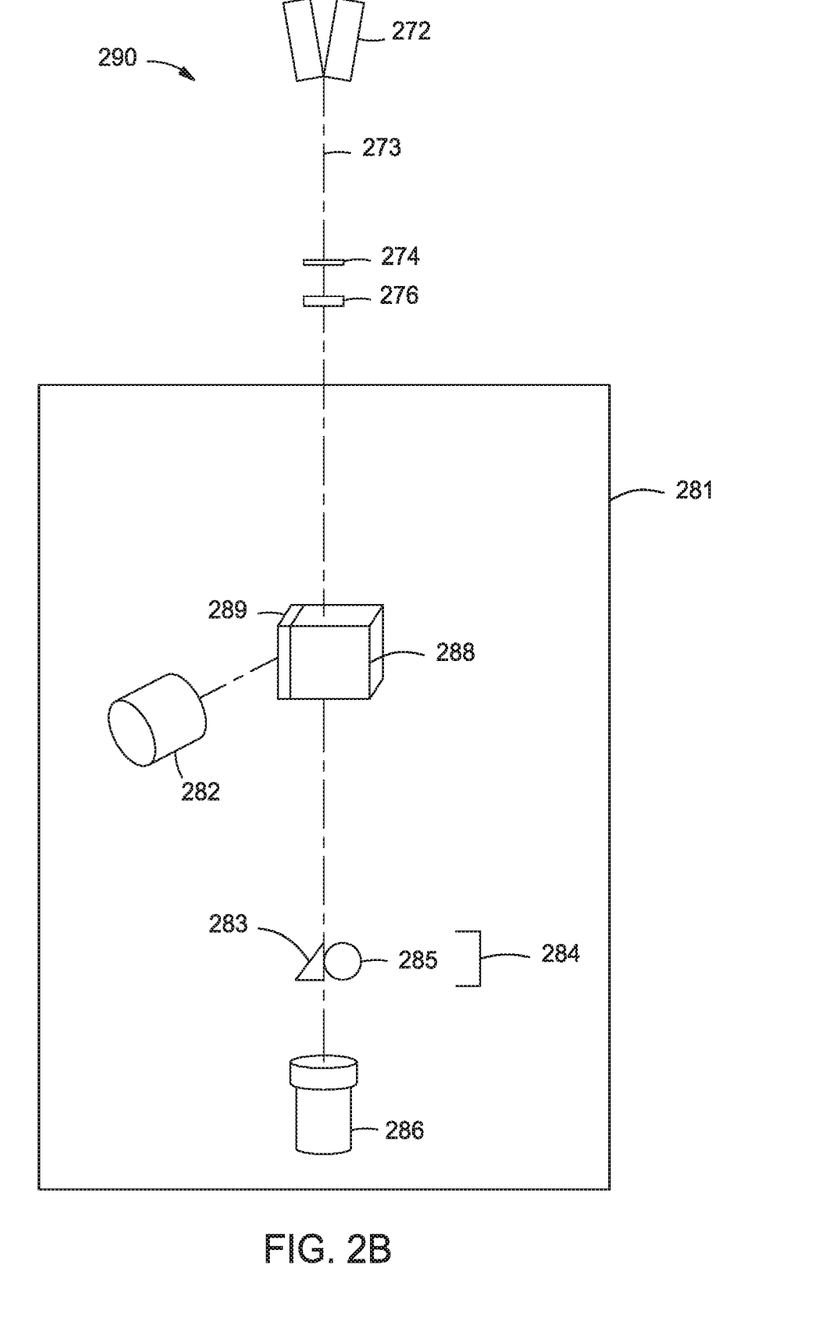
FIG. 2B is a perspective schematic view of an image projection system utilizing one or more DMDs, according to another embodiment.

FIG. 2B is an image project apparatus 281 according to embodiments described herein. In the embodiment shown in FIG. 2B, the image projection apparatus 281 uses one or more DMDs 289 as the spatial light modulator(s). The image projection apparatus 281 is part of an image projection system 290, which includes a light source 272, an aperture 274, a lens 276, a total internal reflection (TIR) prism assembly 288, one or more DMDs 289 (one is shown), and a light dump 282, in addition to the alignment and inspection system 284 and the projection optics 286. The light source 272 is any suitable light source, such as a light emitting diode (LED), OLEDs, or a laser, capable of producing a light having predetermined wavelength. In one embodiment, the predetermined wavelength is in the blue or near ultraviolet (UV) range, such as less than about 450 nm. The TIR prism assembly 288 includes a plurality of reflective surfaces. The projection lens 286 is, as an example, a 10× objective lens.

During operation of the image projection apparatus 281 shown in FIG. 2B, a light beam 273 having a predetermined wavelength, such as a wavelength in the blue range, is produced by the light source 272. The light beam 273 is reflected to the DMD 289 by the TIR prism assembly 288. The DMD includes a plurality of mirrors, and the number of mirrors corresponds to the number of pixels to be projected. The plurality of mirrors are individually controllable, and each mirror of the plurality of mirrors is at an "on" position or "off" position, based on the mask data provided to the DMD 289 by the controller (not shown). When the light beam 273 reaches the mirrors of the DMD 289, the mirrors that are at "on" position reflect the light beam 273, i.e., forming the plurality of write beams, to the projection lens 286. The projection lens 286 then projects the write beams to the surface of the substrate 140. The mirrors that are at "off" position reflect the light beam 273 to the light dump 282 instead of the surface of the substrate 140.

Figure 3A:
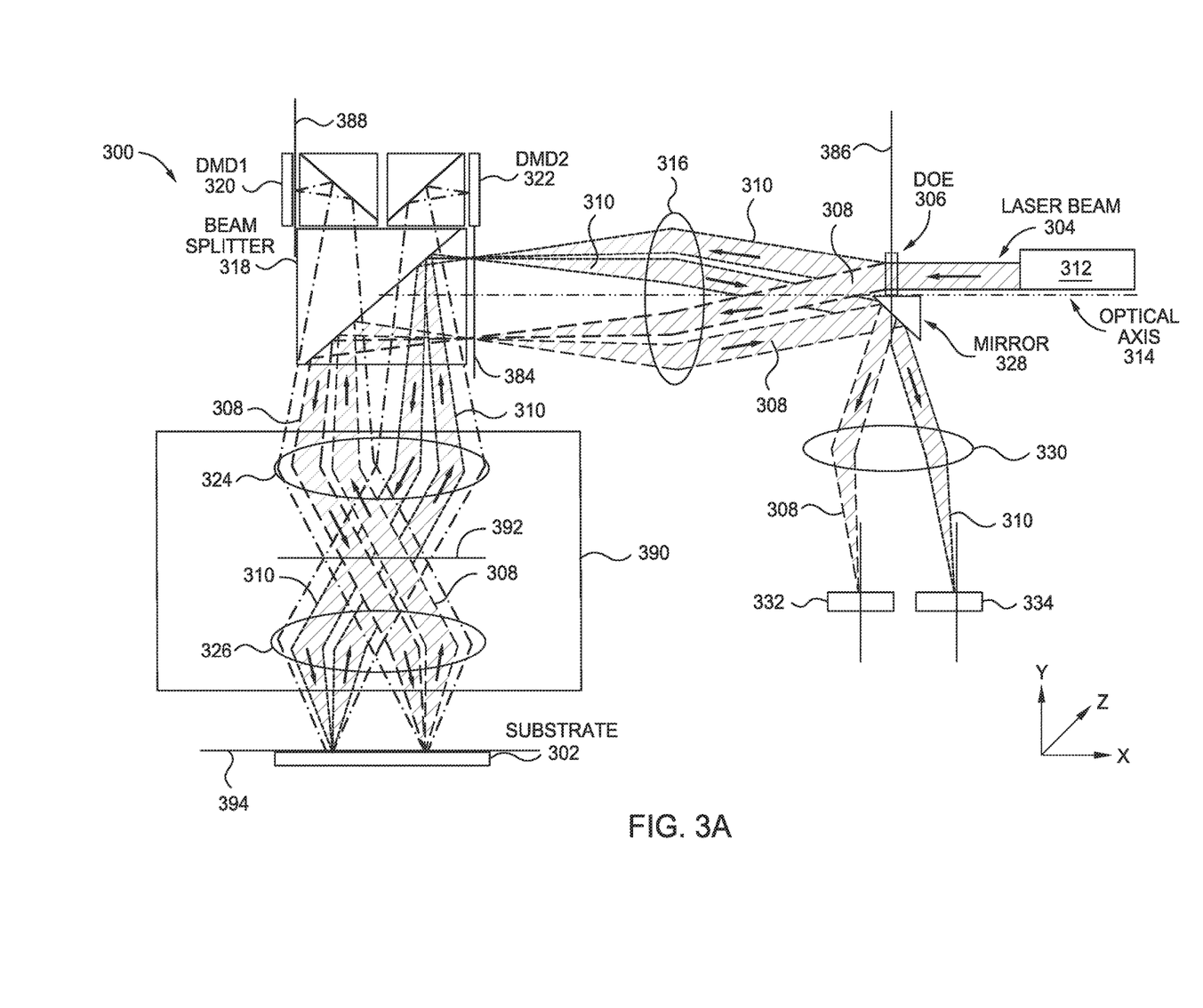
FIG. 3A illustrates an autofocus system utilized to focus one or more DMDs, according to one embodiment.

FIG. 3A illustrates an autofocus system 300 utilized to focus one or more DMDs, according to one embodiment. The autofocus system 300 is based on laser triangulation principle, and can be used to detect surface height and tilt variations of a substrate 302. The autofocus system 300 may be utilized with the image projection system 290 of FIG. 2B. For example, the autofocus system 300 may be used to individually focus one or more DMDs of an image projection system prior to using the image projection system to pattern and expose a substrate.

The autofocus system 300 comprises a light source 312 configured to output a single light beam 304, such as a laser beam. In one embodiment, the light beam 304 is a collimated beam. The light source 312 is not an exposing light source, and may operate at a different wavelength than the light source 272 of FIG. 2B. The light beam 304 is split into two or more beams 308, 310 by a diffractive optical element (DOE) 306. Splitting the light beam 304 into two or more split beams enables the autofocus system 300 to provide focus feedback at two or more locations on the substrate 302. As shown in the autofocus system 300, the DOE 306 splits the light beam 304 into a first split beam 308 and a second split beam 310. While two split beams 308, 310 are shown, the DOE 306 may split the single light beam 304 into any number of split beams. In one embodiment, the number of split beams is equal to the number of DMDs utilized in an image projection system.

Once split by the DOE 306, the first split beam 308 and the second split beam 310 continue along paths that are disposed at different angles towards a beam splitter 318 (i.e., in the −x direction). For example, as shown in FIG. 3A, the first split beam 308 travels above the optical axis 314 along a path that is disposed at an angle with respect to the optical axis 314 while the second split beam 310 travels below the optical axis 314 along a path that is disposed at an opposite angle of the first split beam 308 with respect to the optical axis 314. The first split beam 308 and the second split beam 310 may be split at the same angle in different directions away from the optical axis 314 while traveling towards the first lens 316.

The first and second split beams 308, 310 then travel through a first lens 316 to the beam splitter 318. The first lens 316 may alter or bend the path of the first and second split beams 308, 310. The first lens 316 may alter or bend the paths of the first and second split beams 308, 310 at the same, but opposite angle. As shown in FIG. 3A, the first lens 316 focuses the first and second split beams 308, 310 to the front focal plane 384 of the first lens 316. The back focal plane 386 of the first lens 316 coincides with the beam splitting surface of the DOE 306 so that the collimated beams of the first and second split beams 308, 310 are focused at the front focal plane 384 of the first lens 316. The front focal plane 384 of the first lens 316 coincides with a virtual image of the first and second DMDs 320, 322 formed through the reflecting surface of the beam splitter 318 (i.e., 45 degree angle with respect to the optical axis 314 of the first lens 316).

The first DMD 320 is offset from the second DMD 320 along the both the x-axis and the z-axis. The first split beam 308 and the second split beam 310 are disposed in the same plane which may be tilted or rotated around the x-axis at an angle to align the first and second split beams 308, 310 with a plane connecting the center of the first DMD 320 to the center of the second DMD 322. The angle of rotation of the plane of the first and second split beams 308, 310 around the x-axis may be about 45 degrees, such as when the first DMD 320 and the second DMD 322 are squared. Thus, the first split beam 308 may be aligned with the center of the projected field of the first DMD 320 and the second split beam 322 may be aligned with the center of the projected field of the second DMD 322. The beam splitter 318 is configured to reflect the first and second split beams 308, 310 by about a 90 degree angle in the y-direction. While only two DMDs 320, 322 are shown, more DMDs may be included in the autofocus system 300, such as 3, 4, or 6 DMDs. The first and second DMDs 320, 322 may each be coupled to a controller 350 (shown in FIGS. 3C-3D).

The beam splitter 318 reflects the first split beam 308 and the second split beam 310 down towards the substrate 302 (i.e., in the −y-direction) by about a 90 degree angle. The first and second split beams 308, 310 then travel through a projection lens 390. The projection lens 390 is the same projection lens that is used to project patterns generated by the DMDs 320, 322 onto the substrate 302. The projection lens 390 may comprise telecentric lenses 324, 326 that consist of many lens elements. The projection lens 390 may be modeled as two paraxial lenses 324, 326, as shown in FIG. 3A.

A back focal plane 384 of a first paraxial lens 324 of the projection lens 390 coincides with the front focal plane 384 of the first lens 316 through the path folded by the reflection of the beam splitter 318. The back focal plane 384 of the first paraxial lens 324 coinciding with the front focal plane 384 of the first lens 316 allows the first and second split beams 308, 310 focused by the first lens 316 to be collimated by the first paraxial lens 324 of the projection lens 390. The back focal plane 392 of a second paraxial lens 326 of the projection lens 390 coincides with the front focal plane 392 of the first paraxial lens 324, at which the paths of the first and second split beams 308, 310 cross. A focal plane 388 aligned with the surface of the first DMD 320 is the conjugate image plane of the front focal plane 384 of the first lens 316.

The front focal plane 392 of the first paraxial lens 324 and the back focal plane 392 of the second paraxial lens 326 also coincide with a pupil plane 392 of the projection lens 390 and the location of the image of the DOE 306 formed by passing through the first lens 316 and the first paraxial lens 324. A front focal plane 394 of the second paraxial lens 326 coincides with a front focal plane 394 of the projection lens 390, which further coincide with the surface of the substrate 302. The focal plane 388 aligned with the surface of the first DMD 320 is imaged on to the focal plane 394 aligned with the surface of the substrate 320 through the projection lens 390. The focal plane 394 aligned with the surface of the substrate 320 is then imaged on to the front focal plane 384 of the first lens 316. While the focal plane 388 aligned with the surface of the first DMD 320 and the front focal plane 384 of the first lens 316 are disposed on the plane, the front focal plane 384 of the first lens 316 is reflected by the beam splitter 318 while the focal plane 388 aligned with the surface of the first DMD 320 is transmitted by the beam splitter 318.

The first and second split beams 308, 310 contact on the substrate 302 at a location corresponding to the individual fields of the first and second DMDs 320, 322 to help determine whether the first and second DMDs 320, 322 are in focus. The first and second split beams 308, 310 are then focused by the second paraxial lens 326 as two spots on the surface of the substrate 302. Since the first DMD 320 and the second DMD 322 are offset, the first and second split beams 308, 310 are aligned with the center of the fields of the first and second DMDs 320, 322, respectively, on the substrate 302, which can be achieved by rotating the DOE 306 around the optical axis 314 by a predetermined angle.

The first split beam 308 and the second split beam 310 each independently contact the substrate 302 as light or laser spots at a first angle (i.e., the angle of incidence), and reflect off the substrate 302 at a second angle (i.e., the angle of reflection). The first split beam 308 and the second split beam 310 reflect off the substrate 302 to travel in the y-direction and pass back through the second paraxial lens 326 to cross path at the pupil 392 of the projection lens 390 (i.e., the back focal plane 392 of the second paraxial lens 326), but at the opposite location in the pupil 392 with respect to the beam location of the incoming path. The beam path of the incoming first and second split beams 308, 310 are therefore separated from the returning path of the first and second split beams 308, 310. The pupil plane 392 of projection lens 390 is a conjugate image plane of the DOE 306.

The first and second split beams 308, 310 reflect off the beam splitter 318 and pass back through the first lens 316 towards the DOE 306 (i.e., in the x-direction). Since the DOE 306 is offset from the optical axis 314, the returning path of the first and second split beams 308, 310 cross paths at the same plane of the DOE 306, but at the opposite side of the optical axis 314 (i.e., in the −y-direction), allowing a mirror 328 to reflect the first and second split beams 308, 310 towards a first position detector 332 and a second position sensor 334. The first and second split beams 308, 310 then reflect off the mirror 328 disposed below the DOE 306, and pass through a focusing lens 330. The back focal plane of the focusing lens 330 coincides with the mirror 328, and the front focal plane of the focusing lens 330 coincides with the first and second position detectors 332, 334.

The first split beam 308 then contacts the first position sensor 332 as a first light or laser spot, and the second split beam 310 simultaneously contacts the second position sensor 334 as a second light or laser spot. The position sensors 332, 334 may be imaging sensors. The position sensors 332, 334 are configured to measure the position of the light or laser spots on the sensors 332, 334 at a conjugate image plane of the substrate 302. The light or laser spots on the sensors 332, 334 may correspond to a location of the individual fields of the first and second DMDs 320, 322 on the substrate 302. If the surface of the substrate 302 comprises any height variations, the position of the light spots on the sensors 332, 334 will move. The position sensors 332, 334 are utilized to determine a surface topology of the substrate, including a range of surface height variations and surface tilt variations. The position sensors 332, 334 are coupled to a controller 350 (shown in FIGS. 3C-3D) configured to receive the measured positions and to adjust the first and second DMDs 320, 322 as needed. While two position sensors 332, 334 are show, any number of position sensors may be included. Furthermore, only one position sensor may be utilized, and may be configured to receive both light spots from the first and second split beams 308, 310.

The light beam 304 may have an offset with respect to the optical axis 314 so that the first and second split beams 308, 310 incident on the substrate 302 are disposed at an oblique angle after passing through the one or more second projection lenses 324, 326. Thus, the first and second split beams 308, 310 contact the substrate 302 at a first angle (i.e., the angle of incidence) and reflect off the substrate 302 at a second angle (i.e., the angle of reflection). Because of the oblique incident angle, height changes on the surface of the substrate 302 generate positional shifts of the light or laser spots on the substrate 302, which are then detected by the position sensors 332, 334 at the conjugate image plane of the substrate 302 on the position sensors 332, 334, determining a surface topology of the substrate 302. For example, if a portion of the surface of the substrate 302 is disposed at a lower depth (i.e., in the −y-direction) than the surrounding areas of the substrate 302, the first split beam 308 may contact the lower portion at a slightly different location or alignment than the second split beam 310 contacting a higher surrounding area of the substrate 302.

Figure 3B:
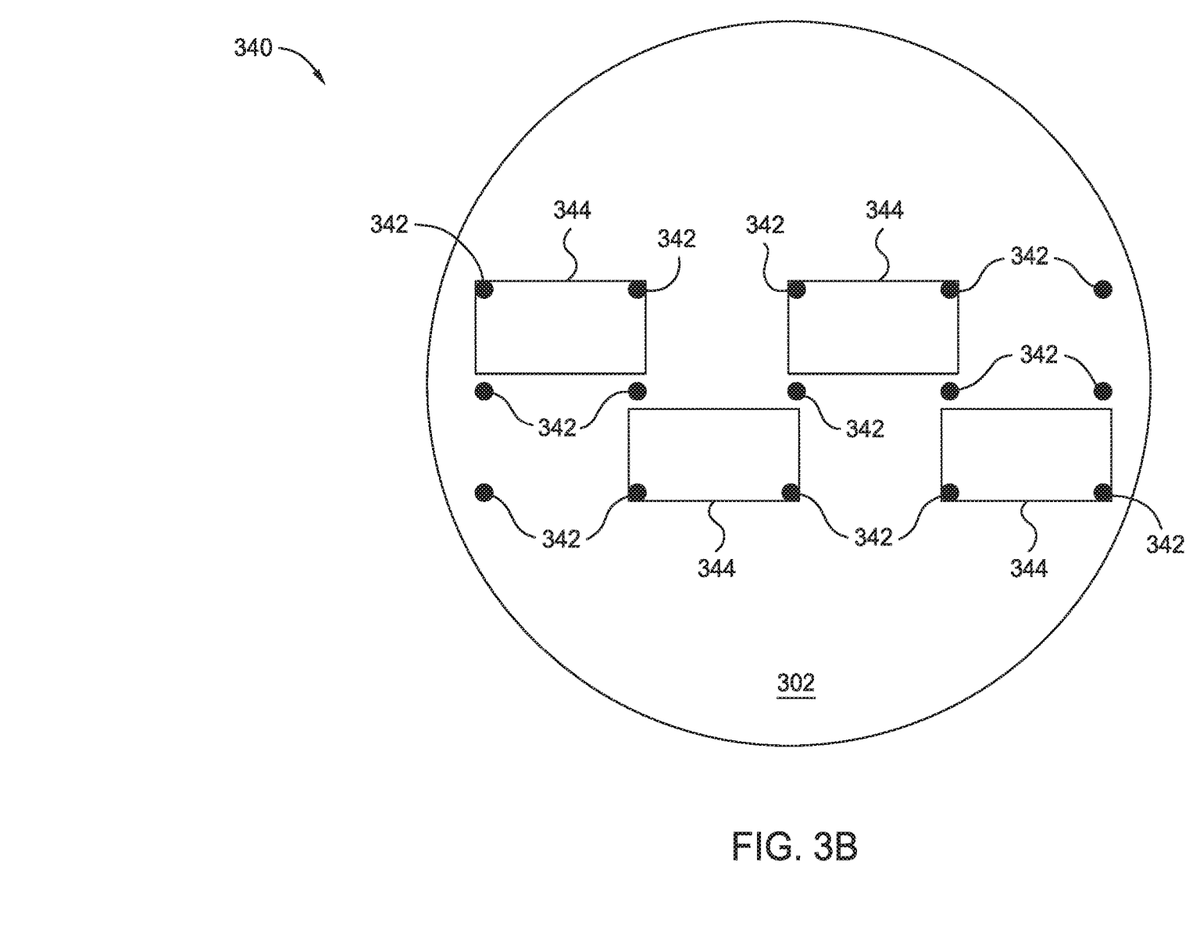
FIG. 3B illustrates an example of autofocus spots generated using an autofocus system to provide focus feedback for DMDs, according to one embodiment.

FIG. 3B illustrates an example 340 of autofocus spots 342 generated using an autofocus system 300 to provide focus feedback for four DMDs. While FIG. 3A shows only two DMDs 320, 322, four DMDs may be included in the autofocus system 300 but are not shown due to the configuration of the DMDs. As shown in FIG. 3B, twelve autofocus spots 342 are shown on a surface of the substrate 302. Four projected DMD fields 344 corresponding to four DMDs are also shown on the substrate 302. Autofocus spots 342 are disposed in and aligned with at least two corners of each of the four projected DMD fields 344. While twelve autofocus spots 342 are shown, the number of autofocus spots 342 utilized may depend on the size of the projected DMD fields 344 and on the surface of the substrate 302. For example, a relatively flat substrate 302 may require fewer autofocus spots 342 than a substrate 302 having numerous surface height and/or tilt variations. As such, the number of autofocus spots 342 may vary. In one embodiment, each projected DMD field 344 may have between 1-10 corresponding autofocus spots 342. Furthermore, the position sensors utilized to generate the autofocus spots 342 can be separate or individual detectors, with one position detector for each autofocus spot 342. Alternatively, a single position sensor, such as a CMOS/CCD imaging sensor that detects the positions of all autofocus spots 342 simultaneously, may be used.

The autofocus system 300 utilizes one or more autofocus spots 342 to detect the surface height or tilt angle at one or more locations within the areas of projected DMD fields 344 on the substrate 302, allowing each DMD 320, 322 to have independent autofocus feedback. Furthermore, the autofocus system utilizes the autofocus spots 342 and the focus feedback of each DMD 320, 322 to determine a surface topology of the substrate 302. Determining the surface topology of the substrate 302 enables the DMDs 320, 322 to be individually adjusted as needed prior to exposing the substrate 302 using an image projection system, which results in a more accurate and efficient exposure of the substrate 302.

If the surface of the substrate 302 comprises height or tilt variations, one or more of the autofocus spots 342 will move such that the autofocus spots 342 are displaced in the respective projected DMD field 344. For example, an autofocus spot 342 encountering a height or tilt variation may not be disposed in and/or aligned with a corner of a projected DMD field 344. In one embodiment, one or more autofocus spots 342 encountering a height or tilt variation may cause the one or more autofocus spots 342 to move up, down, left, or right. The one or more autofocus spots 342 being displaced indicate a surface height or tilt variation of the substrate 302.

Each of the DMDs in the system may require a different focus than the other DMDs. However, because each projected DMD field 344 has its own corresponding autofocus spots 342, the focus of each DMD can be controlled individually to compensate for the surface height or tilt variations of the substrate 302. The autofocus spots 342 are then translated back to the position sensors 332, 334, and the position sensors 332, 334 measure the position of the autofocus spots 342. Thus, when a height or tilt variation of the substrate 302 is detected, the position of the light or laser spots on the position sensors 332, 334 moves. The position sensors 332, 334 are coupled to a controller 350 (shown in FIGS. 3C-3D) configured to individually adjust the DMDs to adjust the focus of each DMD as needed. The focus of each DMD may be adjusted by moving one or more elements inside the various projection lenses 316, 324, 326, by tilting and/or moving the DMD 320, 322 in the x-direction, the y-direction, and/or the z-direction, and/or by moving the substrate 302.

Figure 3C:
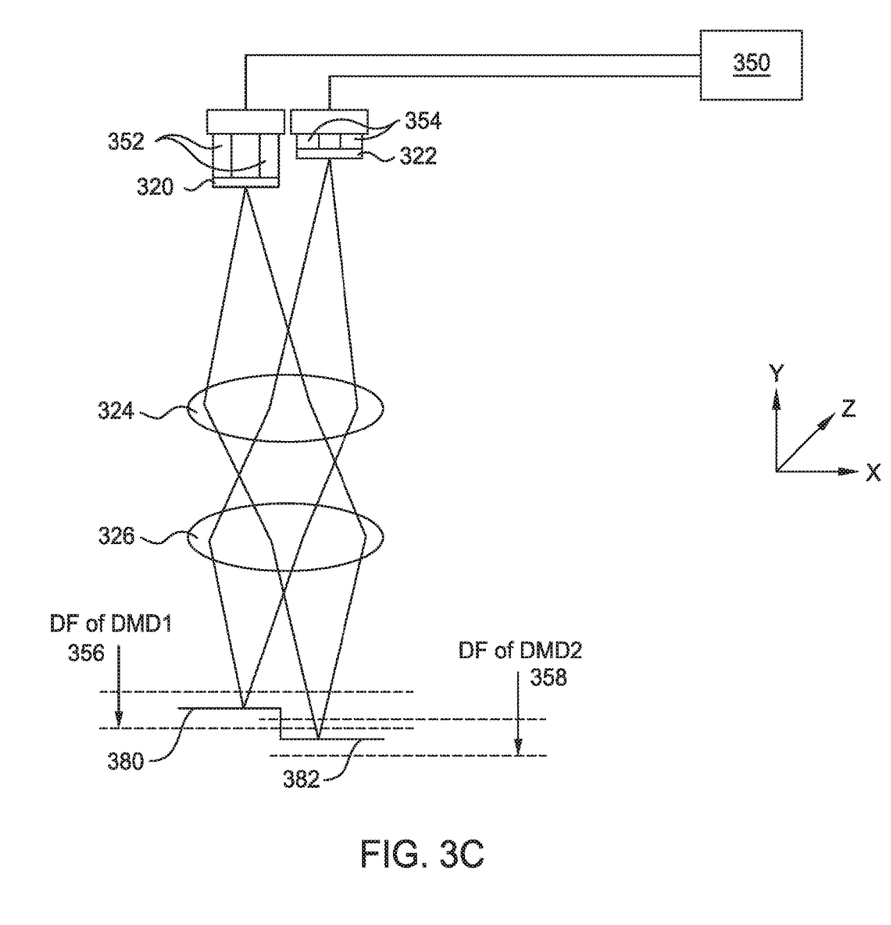
FIGS. 3C-3D illustrate adjusting one or more DMDs using an autofocus system, according to one embodiment.
Figure 3D:
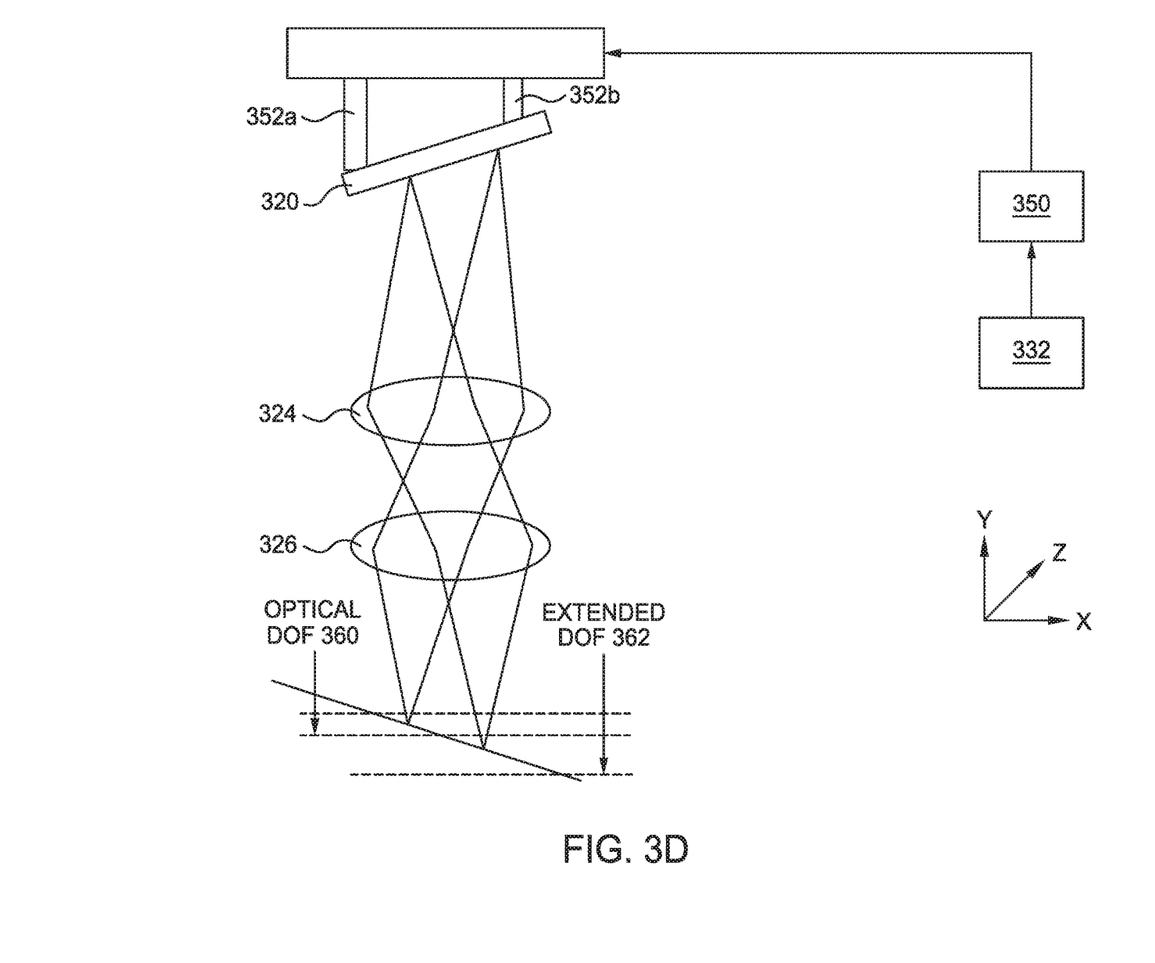

FIGS. 3C-3D illustrate adjusting one or more of the DMDs 320, 322 utilizing the autofocus system 300, according to one embodiment. The DMDs 320, 322 may be individually adjusted in the x-direction, the y-direction, the z-direction, and/or tilted based on the determined surface topology, along with other factors, such as the thickness of a resist disposed on the surface of the substrate to be patterned, and the pattern to be printed on the substrate, etc.

The autofocus system 300 further comprises a controller 350 coupled to the first DMD 320 and the second DMD 322. The first DMD 320 is coupled to a first set of actuators 352, and the second DMD 322 is coupled to a second set of actuators 354. The first set of actuators 352 is configured to adjust the position of the first DMD 320 in the x-direction, the y-direction, and/or the z-direction. The second set of actuators 354 is configured to adjust the position of the second DMD 322 in the x-direction, the y-direction, and/or the z-direction.

The first and second DMDs 320, 322 may be configured to extend the field size and/or to extend the depth of focus. The depth of focus (DF) 356 of the first DMD 320 and the depth of focus 358 of the second DMD 322 are fundamentally limited by a ratio of wavelength to numerical aperture squared ($\lambda/NA^2$). For example, by offsetting the DMDs 320, 322 from one another in the z-direction, having the first DMD 320 project patterns at a first height 380, and having the second DMD 322 project patterns at a second height 382, the total depth of focus may be effectively doubled.

Furthermore, the actuators 352a, 352b of first set of actuators 352 are configured to move independently from one another to tilt the first DMD 320, and the actuators comprising the second set of actuators 352 are configured to move independently from one another to tilt the second DMD 322. Tilting one or both of the first DMD 320 and the second DMD 322 with respect to a scan plane (i.e., the x-axis) may result in the depth of field being extended. Moreover, more than one set of actuators 352, 354 may be coupled to each DMD 320, 322, respectively, to adjust the DMDs 320, 322 in the x-direction, the y-direction, the z-direction, and/or to tilt the DMDs 320, 322 such that the DMDs 320, 322 are disposed at an angle with respect to the scan plane in order to optimize and extend both the depth of focus and the depth of field.

As shown in FIG. 3D, the first set of actuators 352 comprises a first actuator 352a and a second actuator 352b.

While not shown, the second set of actuators 354 similarly comprises a first actuator and a second actuator. The first actuator 352a is configured to move independently from the second actuator 352b. As shown in FIG. 3D, the first actuator 352a has a greater length than the second actuator 352b, resulting in the first DMD 320 being tilted or disposed at an angle with respect to a scan plane (i.e., the x-axis). Tilting the first DMD 320 and using only the pixels of the first DMD 320 that are in focus at the corresponding z-height to print patterns at the corresponding height extends the depth of field (DOF). For example, in FIG. 3D, the optical DOF 360 demonstrates the DOF of the first DMD 320 without being tilted, and the extended DOF 362 demonstrates the DOF of the first DMD 320 when tilted or disposed at an angle with respect to the scan plane.

Figure 3E:
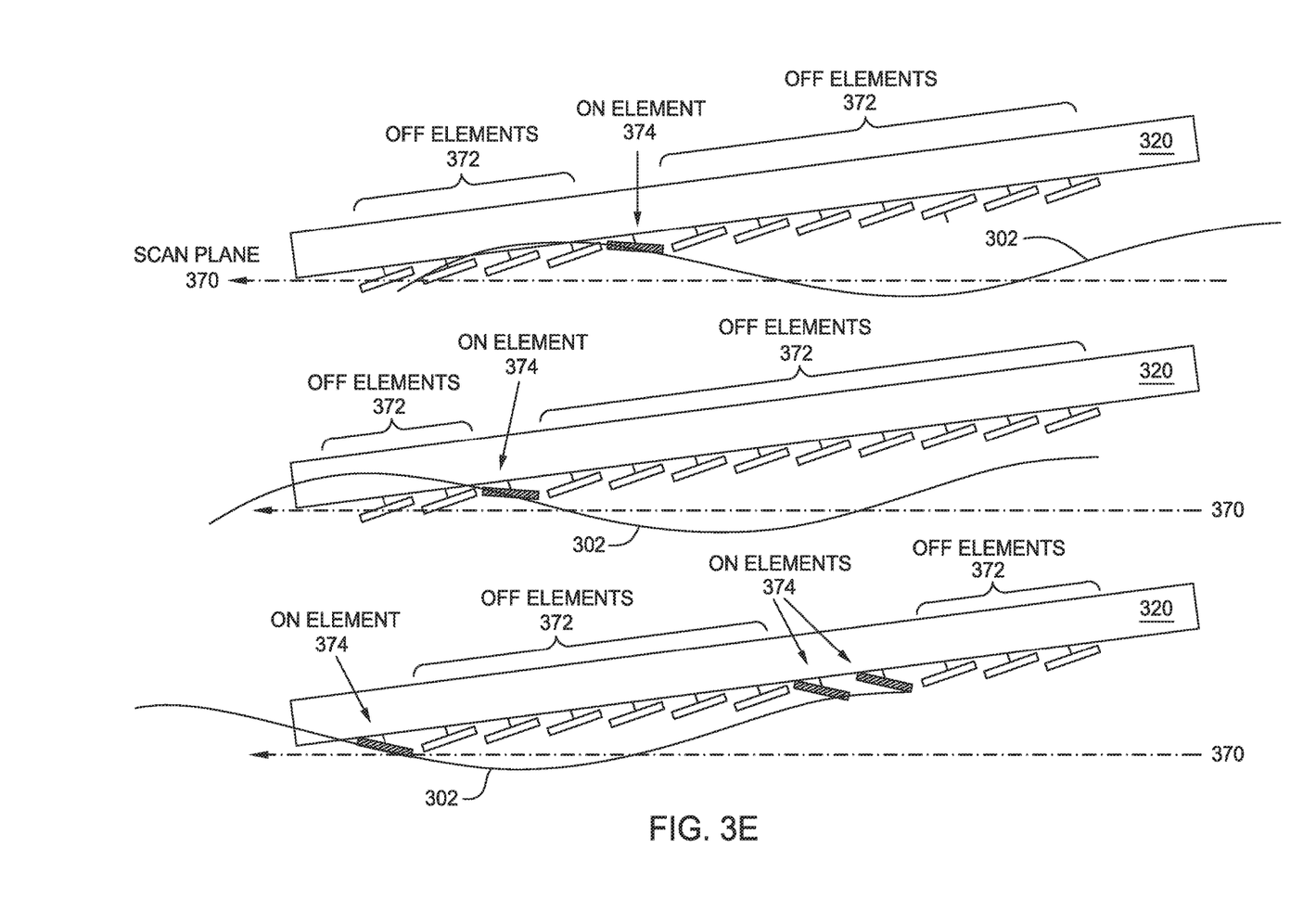
FIG. 3E illustrates a DMD comprising a plurality of DMD elements at various stages of scanning a substrate, according to one embodiment.

The depth of field can be extended continuously by tilting the DMDs 320, 322. By continuously tilting one or more of the DMDs 320, 322, different rows of DMD elements can be projected to different focal planes, as shown in FIG. 3E. FIG. 3E illustrates a DMD 320 comprising a plurality of DMD elements 372, 374 at various stages of scanning a substrate 302. In FIG. 3E, the first DMD 320 comprises a plurality of DMD elements 372, 374, such as pixels or mirrors, disposed adjacent to one another in rows and columns (i.e., disposed in three dimensions). Each of the plurality of DMD elements may be turned "on" (DMD elements 374) or turned "off" (DMD elements 372).

By tilting the first DMD 320 with respect to the scan plane 370, only the elements 374 in focus are turned on when a substrate 302 having surface height variation scans through the projection field. Thus, the DMD 320 may be tilted to select which DMD elements 374 to turn "on". Tiling the DMD 320 enables the plurality of DMD elements 372, 374 to be adjusted so that various DMD elements 372, 374 may be individually disposed at different positions to compensate for different heights of the substrate when being exposed in an image projection system. Additionally, the DMD elements 372 are allocated in three dimensions, allowing the number of repeating exposures needed to achieve sub-pixel resolution to be reduced.

Alternatively, rather than tiling the DMDs 320, 322, the DMDs 320, 322 may be moved in the z-direction during scanning when exposing to extend the depth of focus. The timing of movement in the z-direction may be synchronized with the scanning of the surface in the x-direction such that the exposure is uniformly distributed. For example, the substrate 302 may move one field size in the x-direction while a DMD 320 moves one cycle in the extended focal range in the z-direction (i.e., a triangular wave form).

Once the surface topology of the substrate 302 is determined, the plurality of DMDs 320, 322 may be tilted and/or moved along the x-axis, the y-axis, and/or the z-axis to individually adjust the DMDs 320, 322 with respect to the surface topology of the substrate 302. The plurality of DMDs 320, 322 may then be utilized in an image projection system, such as the image projection system 290 of FIG. 2B. As the substrate 302 is passing through the image projection system, individual DMD elements 372, 374 of each DMD 320, 322 are turned "on" or "off" based on whether the DMD elements are in the proper focus at that point of the surface topology. Thus, the autofocus system is utilized to adjust the DMDs 320, 322 with respect to the surface topology of the substrate 302 prior to exposing the substrate 302 in an image projection system 290. As such, the DMDs 320, 322 are static when used in the image projection system, and are previously adjusted based on the determined surface topology, along with other factors, such as the thickness of the resist on the substrate to be patterned, and the pattern to be printed on the substrate.

Figure 4:
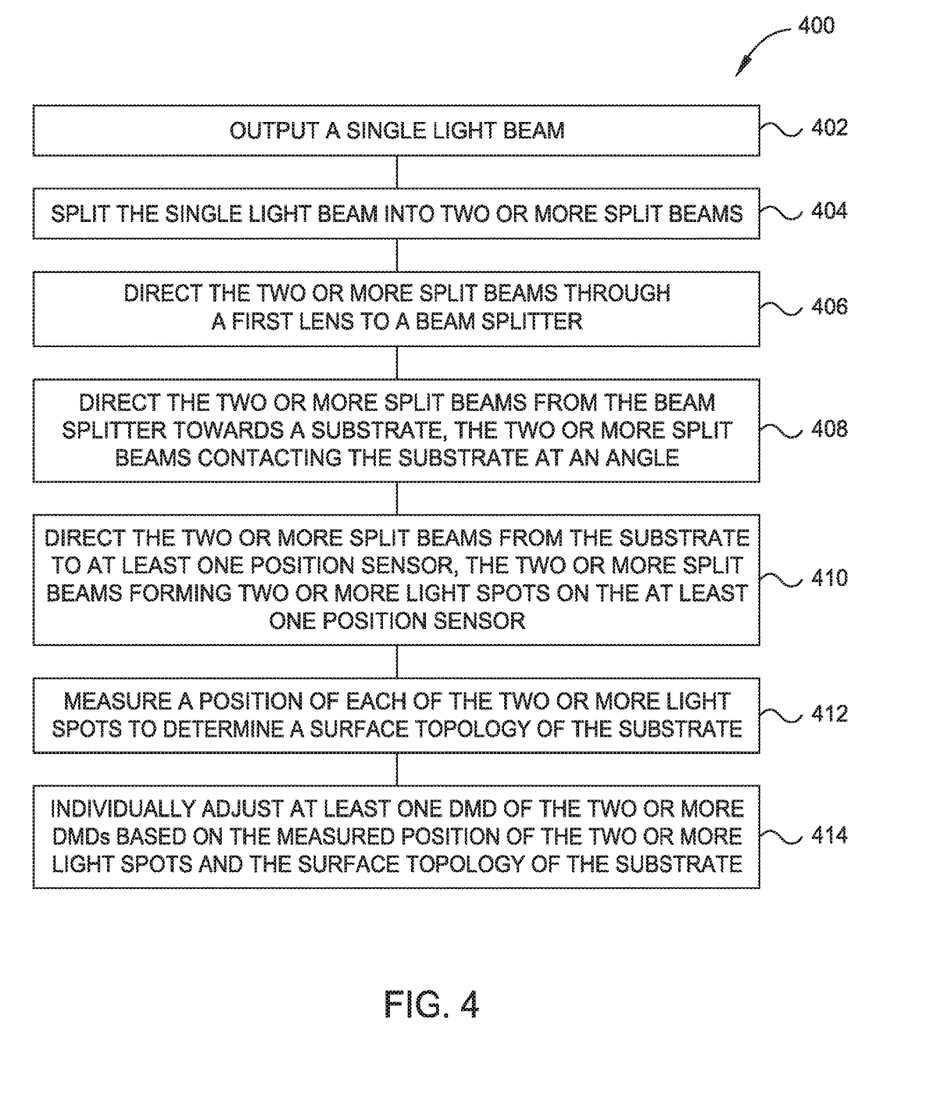
FIG. 4 illustrates a method of autofocusing two or more digital micromirror devices, according to another embodiment.

FIG. 4 illustrates a method 400 of autofocusing two or more digital micromirror devices, according to one embodiment. Method 400 may be utilized with the autofocus system 300 of FIGS. 3A-3E. For clarity, method 400 is described with reference to various elements of FIGS. 3A-3E.

In operation 402, a single light beam 304 is output by a light source 312. The single light beam 304 may be a laser beam. The light source 312 may be distinct from a light source utilized in an image projection system to expose a substrate. Additionally, the light beam 304 may have a different wavelength than a laser beam used for exposing a substrate. In operation 404, the single light beam 304 is split into two or more split beams 308, 310. The single light beam 304 may be split using a DOE 306, as shown and described above in FIG. 3A.

In operation 406, the two or more split beams 308, 310 are directed through a first lens 316 to a beam splitter 318, as shown and described above in FIG. 3A. In operation 408, the two or more split beams 308, 310 are directed from the beam splitter 318 towards a substrate 302. The two or more split beams 308, 310 contact the substrate 302 at a first angle (i.e., the angle of incidence). The two or more split beams 308, 310 pass through a projection lens 390 comprised of a first paraxial lens 324 and a second paraxial lens 326 prior to reaching the substrate 302, as shown and described above in FIG. 3A.

In operation 410, the two or more split beams 308, 310 are directed from the substrate 302 to at least one position sensor 332, 334. The two or more split beams 308, 310 reflect off the substrate 302 at a second angle (i.e., the angle of reflection). The two or more split beams 308, 310 form two or more light or laser spots on at least one position sensor 332, 334. The two or more split beams 308, 310 may pass through or reflect off of the projection lens 390 comprised of the first paraxial lens 324 and the second paraxial lens 326, the beam splitter 318, the first lens 316, a mirror 328, and a focusing lens 330 prior to reaching the at least one position sensor 332, 334, as shown and described above in FIG. 3A.

In operation 412, a position of each of the two or more light or laser spots are independently measured using the at least one position sensor 332, 334. The current measured positions of each of the two or more light or laser spots may then be compared to a previous measurement to determine whether the light or laser spots have moved. The positions of the light or laser spots moving indicate a surface height or tilt variation of the substrate 302. Thus, independently measuring the positions of the two or more light or laser spots helps determine a surface topology of the substrate 302. The positions of the two or more light or laser spots may be translated to a controller 350 coupled to the two or more DMDs 320, 322 to provide focus feedback for the two or more DMDs 320, 322.

In operation 414, at least one DMD of the two or more DMDs 320, 322 is individually adjusted based on the measured positions of the two or more light or laser spots and the surface topology of the substrate 302, among other factors. The DMDs 320, 322 may be individually adjusted using the sets of actuators 352, 354. The DMDs 320, 322 may be individually adjusted along the x-axis, the y-axis, and/or the z-axis and/or tilted to focus each DMDs 320, 322, as shown and described above in FIGS. 3A-3E. Method 400 may be repeated one or more times to determine a complete surface topology of the entire substrate 302 and to adjust the DMDs 320, 322 with respect to the determined surface topology of the substrate 302. Once the DMDs 320, 322 are adjusted with respect to the determined surface topology of the substrate 302, the DMDs 320, 322 may be utilized in an image projection system to pattern and expose the substrate 302.

Utilizing the autofocus system allows a plurality of DMDs in an image projection system to be individually adjusted and focused as need. Individually adjusting the plurality of DMDs enables both the depth of field and the depth of focus to be extended. Furthermore, surface height and tilt variations of a substrate may be taken into consideration when patterning the substrate, making the substrate exposure process more efficient and accurate. As such, autofocusing the plurality of DMDs using the autofocus system reduces costs and production times associated with exposing substrates, extends both the depth of field and the depth of focus of the plurality of DMDs, and increases the overall throughput of the digital lithography system.

While the foregoing is directed to embodiments of the present disclosure, other and further embodiments of the disclosure may be devised without departing from the basic scope thereof, and the scope thereof is determined by the claims that follow.

What is claimed is:

1. An autofocus system, comprising:
a light source configured to output a light beam;
a diffractive optical element disposed adjacent to the light source, the diffractive optical element configured to split the light beam into two or more split beams;
a beam splitter disposed adjacent to the diffractive optical element;
two or more digital micromirror devices disposed adjacent to the beam splitter; and
at least one position sensor, wherein the two or more split beams form two or more light spots on the at least one position sensor, and wherein the at least one position sensor is configured to measure a position of each of the two or more light spots.

2. The autofocus system of claim 1, further comprising:
a controller coupled to each of the two or more digital micromirror devices, wherein the two or more light spots correspond to a location of individual fields of the two or more digital micromirror devices, and wherein the controller is configured to receive the measured positions of the two or more light spots.

3. The autofocus system of claim 2, wherein each digital micromirror device of the two or more digital micromirror devices is coupled to a set of actuators, and wherein the controller is configured to individually control each set of actuators.

4. The autofocus system of claim 3, wherein a first set of actuators coupled to a first digital micromirror device of the two or more digital micromirror devices is configured to individually adjust the first digital micromirror device.

5. The autofocus system of claim 4, wherein adjusting the first digital micromirror device comprises tilting the digital micromirror device.

6. The autofocus system of claim 4, wherein adjusting the first digital micromirror device comprises adjusting a height of the first digital micromirror device.

7. The autofocus system of claim 1, further comprising:
a first lens disposed between the diffractive optical element and the beam splitter, wherein the first lens is configured to alter each path of the two or more split beams.

8. The autofocus system of claim 1, wherein the beam splitter is configured to alter paths of the two or more split beams by about a 90 degree angle.

9. The autofocus system of claim 1, further comprising:
a projection lens disposed adjacent to the beam splitter, the projection lens comprising a first paraxial lens and a second paraxial lens;
a mirror disposed adjacent to the at least one position sensor; and
a focusing lens disposed between the mirror and the at least one position sensor.

10. The autofocus system of claim 1, wherein the at least one position sensor comprises a first position sensor and a second position sensor, and wherein a first light spot of the two or more light spots is formed on the first position sensor and a second light spot of the two or more light spots is formed on the second position sensor.

11. A method of autofocusing two or more digital micromirror devices, comprising:
outputting a light beam by a light source;
splitting the light beam into two or more split beams by a diffractive optical element disposed adjacent to the light source;
directing the two or more split beams to a beam splitter, wherein the two or more split beams align with projection fields of two or more digital micromirror devices, the two or more digital micromirror devices being disposed adjacent to the beam splitter;
directing the two or more split beams from the beam splitter to a substrate, wherein the two or more split beams contact the substrate at an angle;
directing the two or more split beams from the substrate to at least one position sensor, wherein the two or more split beams form two or more light spots on the at least one position sensor; and
measuring a position of each of the two or more light spots using the at least one position sensor.

12. The method of claim 11, further comprising:
translating the position of each of the two or more light spots to a controller coupled to the two or more digital micromirror devices; and
adjusting, individually, at least one digital micromirror device of the two or more digital micromirror devices based on the measured positions of the two or more light spots.

13. The method of claim 12, wherein adjusting, individually, the at least one digital micromirror device of the two or more digital micromirror devices individually focuses the at least one digital micromirror device.

14. The method of claim 13, wherein adjusting, individually, the at least one digital micromirror device of the two or more digital micromirror devices comprises one or more of adjusting a height of the at least one digital micromirror device and adjusting an angle of the at least one digital micromirror device to tilt the at least one digital micromirror device with respect to a scan plane.

15. The method of claim 12, wherein directing the two or more split beams from the beam splitter to the substrate and directing the two or more split beams from the substrate to one or more position sensors determines a surface topology of the substrate.

16. The method of claim 15, wherein adjusting, individually, the at least one digital micromirror device of the two or more digital micromirror devices is further based on the surface topology of the substrate.

17. A method of autofocusing two or more digital micromirror devices, comprising:

outputting a light beam by a light source;

splitting the light beam into two or more split beams by a diffractive optical element disposed adjacent to the light source;

reflecting two or more light beams off of a beam splitter, wherein the two or more split beams align with projection fields of two or more digital micromirror devices, the two or more digital micromirror devices being disposed adjacent to the beam splitter;

reflecting the two or more light beams from the beam splitter off of a substrate;

directing the two or more light beams from the substrate to at least one position sensor, wherein the two or more light beams form two or more light spots on the at least one position sensor;

measuring a position of each of the two or more light spots using the at least one position sensor; and adjusting, individually, at least one digital micromirror device of the two or more digital micromirror devices based on the measured position of each of the two or more light spots.

18. The method of claim 17, wherein reflecting the two or more light beams from the beam splitter off of the substrate, directing the two or more light beams from the substrate to the at least one position sensor, and measuring the position of each of the two or more light spots determines a surface topology of the substrate.

19. The method of claim 18, wherein adjusting, individually, the at least one digital micromirror device of the two or more digital micromirror devices individually focuses the at least one digital micromirror device with respect to the determined surface topology of the substrate.

20. The method of claim 19, wherein adjusting, individually, the at least one digital micromirror device comprises one or more of adjusting a height of the at least one digital micromirror device and adjusting an angle of the at least one digital micromirror device to tilt the at least one digital micromirror device with respect to a scan plane.

* * * * *